United States Patent [19]
Alsmeier et al.

[11] Patent Number: 5,674,769
[45] Date of Patent: Oct. 7, 1997

[54] PROCESS FOR FORMING DEEP TRENCH DRAMS WITH SUB-GROUNDRULE GATES

[75] Inventors: Johann Alsmeier; Christine Dehm, both of Wappingers Falls, N.Y.; Erwin Hammerl, Emmerting; Reinhard J. Stengl, Stadtbergen, both of Germany

[73] Assignee: Siemens Aktiengesellschaft, Munich, Germany

[21] Appl. No.: 665,183

[22] Filed: Jun. 14, 1996

[51] Int. Cl.⁶ .................................................. H01L 21/8242
[52] U.S. Cl. .................. 437/52; 437/60; 437/919; 437/203
[58] Field of Search ......................... 437/52, 60, 919, 437/203

[56] References Cited

U.S. PATENT DOCUMENTS

5,073,515  12/1991  Roehl et al. ........................ 437/52
5,106,774  4/1992  Hieda et al. ........................ 437/52
5,429,978  7/1995  Lu et al. ............................. 437/52

Primary Examiner—Jey Tsai
Attorney, Agent, or Firm—Dexter K. Chin

[57] ABSTRACT

A method of fabricating sub-GR gates in a deep trench DRAM cell. The method comprises depositing, removing, and selectively etching a plurality of layers which include sacrificial spacers, liners, masking, and resist layers of both semiconducting and non-semiconducting materials on a semiconductor substrate according to specific process flows designed to circumvent the problems associated with prior art sub-GR processes. The method represents an improvement on standard gate conductor processes and provides a device which achieves an up to now unachieved decoupling of channel doping and junction doping.

24 Claims, 5 Drawing Sheets

PROCESS FOR FORMING DEEP TRENCH DRAMS WITH SUB-GROUNDRULE GATES

FIELD OF THE INVENTION

The field of the present invention relates generally to dynamic random access memories (DRAMs), and more particularly to techniques for fabricating sub-groundrule (sub-GR) device gates and gate level pitches.

BACKGROUND OF THE INVENTION

The art of DRAM chip processing has changed dramatically over the past few years, sparked by the insatiable need for increased memory capacity. Each new generation of DRAM chips is characterized by a halving of device dimensions, resulting in a four-fold density increase over the preceding generation. The problems encountered with this technology stem from difficulties in maintaining a sufficiently high stored charge per capacitor unit area in the DRAM, and the resolution capability of available photolithographic equipment used in the construction of the device. In order to construct high density DRAMs in a reasonable sized chip area, it stands to reason that the cell structures have to change from generation to generation. All efforts to increase capacitance without increasing the planar area of the capacitor have thus been directed toward building three dimensional capacitor structures.

Three-dimensional cell designs and high performance cell dielectrics are being utilized to maintain sufficient cell capacitance as cell horizontal dimensions are shrunk. Using improved photolithographic techniques, the minimum size of features and spaces (or "pitch" as it is referred to in the art) within a DRAM chip has been drastically reduced. However, since the minimum size of features and spaces that a given piece of photolithographic equipment can produce is directly related to its resolution capability, the minimum pitch in the DRAM device can only be reduced so far.

The minimum feature size (F) of a DRAM device is commonly referred to in the art as the groundrule (GR). In a contemporary DRAM cell of conventional design, at least one rowline and a space between rowlines must be created within the X-direction of the cell. This results in an X-direction width of 2 F. Additional X-direction width (typically 1 F) is required for the construction of the cell capacitor. This gives a minimum X-direction width of 3 F. In addition, at least one digit line and a space between digit lines are required in the Y-direction, giving rise to a minimum Y-direction width of 2 F. To determine the area of the DRAM cell, one simply multiplies the X-direction width (3 F) by the Y-direction width (2 F), coming up with a total cell area of 6 $F^2$. While the present invention is concerned with DRAM cells of the 6 $F^2$ variety, it should be noted that DRAM cells with areas up to 20 $F^2$ are commercially available.

As the size of DRAM arrays is decreased while the density of the integrated circuits within them is correspondingly increased, new trench gates and processes that form them will be required. New sub-GR gate conductors and interconnect conductor lines will be needed, and the decoupling of channel doping and junction doping will not only have to be addressed, but will have to be reduced without compromising off current/threshold requirements. Spacer technology and improved photolithographic techniques promise to be invaluable tools which will undoubtedly be used in the design of these future DRAM arrays. In fact, the use of sacrificial spacers for forming sub-GR gates and isolation trenches has already been adopted.

For example, the use of spacer technology for forming sub-GR gates is described in U.S. Pat. No. 5,013,680 entitled "PROCESS FOR FABRICATING A DRAM ARRAY HAVING FEATURE WIDTHS THAT TRANSCEND THE RESOLUTION LIMIT OF AVAILABLE PHOTOLITHOGRAPHY" issued to T. A. Lowrey et al. and assigned to Micron Technology, Inc. This patent describes a DRAM array in which the gate feature size is determined through spacer technology.

The process employs photolithography and shows the creation of ½ F mask strips which are used to etch a matrix of storage trenches. The double-pitch masking technique described therein, in combination with spacer technology, allows for the creation of transistors and interconnect lines having width dimensions far less than the feature resolution of photolithographic processes alone.

Spacer technology may also be used to form isolation trenches as described in U.S. Pat. No. 5,308,784 entitled "SEMICONDUCTOR DEVICE AND METHOD FOR MAKING THE SAME" issued to Y. Kim et al. and assigned to the Samsung Electronics Company, Ltd. The process described therein uses spacers of a material having a different etch rate than that used to form the active areas of the device. These spacers may then be etched away, and the trenches created filled with insulating materials. In this way, the method provides for the isolation of electrical elements in the semiconductor device and reduces parasitic capacitance caused by packing the elements close to each other. With this of method of insulation, the density of the elements on the surface of the substrate may be increased.

Sub-GR gate conductors have also been created by a number of other prior art processes. These processes typically require the use of specialized photolithography tools or resist processes (which include surface imaging layers) that are capable of operating at the GC level. Mask recesses or undercut etches have also been used to reduce GC line sizes. Sub-GR gate conductors have also been created with the use of a spacer hardmask (or oxide spacer at the resist edge). All of these techniques, however, suffer from the disadvantage of forcing the device design to transistors which function in the sub-GR regime. They also require very specific tools and/or processes which fall outside of an otherwise conventional manufacturing line. The devices produced with these prior art techniques also typically have an unsymmetrical GC shape, which is difficult to cap with any other layer that may be necessary to complete the device.

It is therefore a primary objective of the present invention to provide a method to produce sub-GR gate conductor and interconnect conductor lines (having sub-GR pitches) in a deep trench DRAM cell using a process that avoids the problems associated with prior art technologies. It is a further objective of the present invention to provide a high density trench transistor concept which is comparable to the standard transistor technology.

SUMMARY OF THE INVENTION

A method of fabricating sub-GR gates in a deep trench DRAM cell. In one embodiment, a plurality of sacrificial spacer layers, including a layer of oxide, a layer of nitride, and a layer of polysilicon, are deposited on a semiconductor substrate in which the deep trench, shallow trench isolation, and nitride seal regions have already been formed. Portions of the sacrificial spacer layers are etched away and the recess that is formed is filled with a plurality of insulating materials including a layer of polysilicon, a layer of oxide, and a second layer of polysilicon. The layers fill the recess, forming a column-like structure of alternating polysilicon-oxide-polysilicon layers which generally conforms to the shape of the recess. The sacrificial spacer layers are then removed leaving the column-like polysilicon-oxide-polysilicon stack disposed on the semiconductor substrate. Trenches are then etched into the semiconductor substrate along the sides of the polysilicon-oxide-polysilicon stack. The trenches are then suitably lined and filled with conductive material in order to form the sub-GR gates.

BRIEF DESCRIPTION OF THE DRAWINGS

In order to better understand the present invention, reference should be made to the following detailed description taken in conjunction with the accompanying drawings wherein.

DETAILED DESCRIPTION OF THE INVENTION

The present invention provides a new trench gate concept that addresses several important issues which arise when the density of integrated circuits in DRAM devices is increased. First, it addresses a technique for fabricating sub-GR gate conductors or interconnect conductor lines which is applicable with standard gate conductor processes. It also addresses, in accordance with the high density goal, a transistor concept which is comparable to standard transistor technology, but which favors an up to now unachieved decoupling of channel doping and junction doping due to the additional design freedom in the vertical direction. Because of this decoupling of channel doping, the fields at the junction can be effectively reduced without compromising off current/threshold requirements. Under certain trade-off aspects (e.g., current drive versus off leakage current), this device will have better off current characteristics when compared to a prior art planar MOS device.

To facilitate discussion, the invention is described in the context of a DRAM utilizing trench capacitors. However, the invention has much broader applications. For example, the formation of sub-GR gate devices, as described herein, is applicable to DRAMs utilizing stack and capacitor as well as trench technologies. Hence, the invention is applicable to either a trench (gate) conductor or buried trench (gate) conductor.

Figure 1:
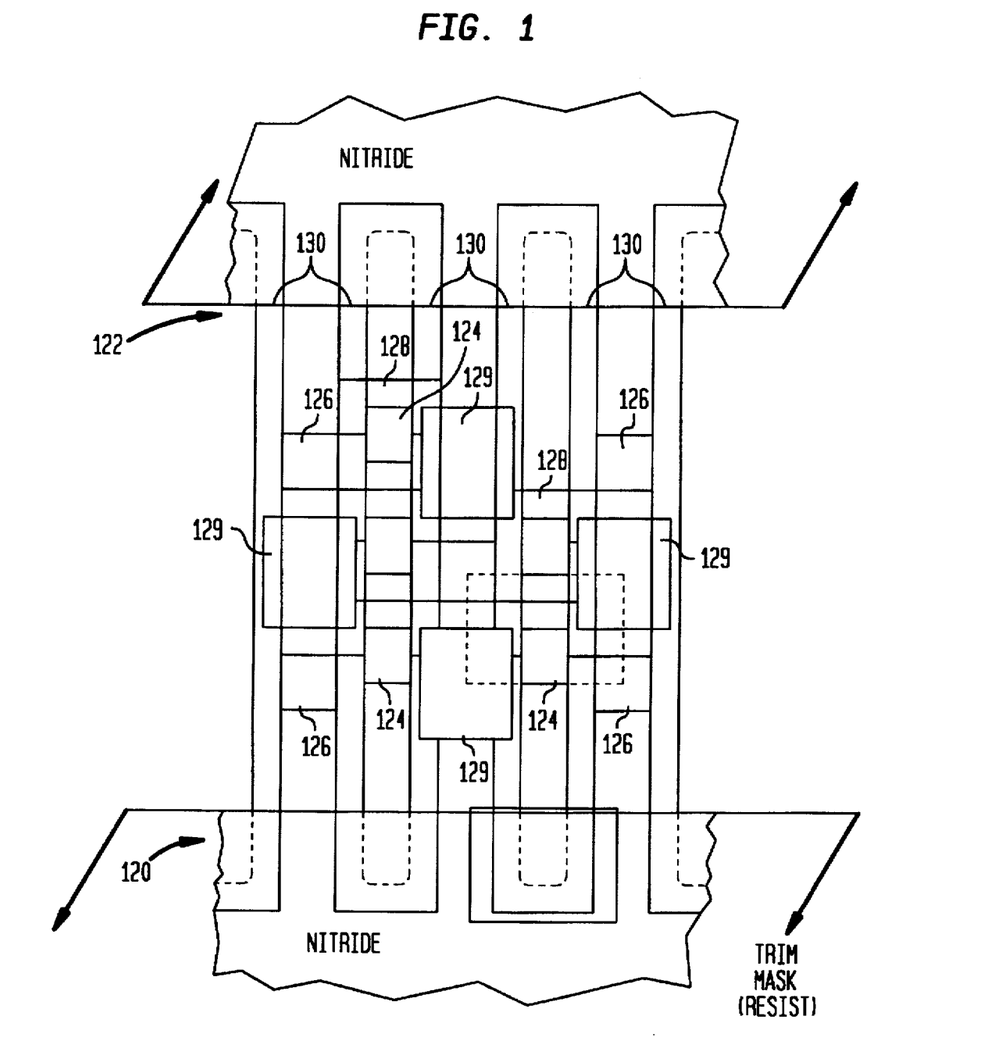
FIG. 1 depicts the layout of a 6 $F^2$ DRAM cell with sub-GR gates of about ½ F.

The following processing steps start with a planarized semiconductor wafer of an exemplary DRAM having DRAM cell size of about 6 $F^2$. The wafer includes deep trenches (DTs) and shallow trench isolations (STI) formed by conventional DRAM processing steps familiar to those skilled in the art. Multiple sacrificial oxide and nitride layers will be deposited and etched away in the following processes, and each of these steps will be done with conventional technology using processes well known to those skilled in the art. The oxide and nitride layers, for example, are typically deposited by chemical vapor deposition (CVD) or other suitable thermal depositing techniques. Etchants such as hydrofluoric acid baths or chemical downstream etchants will be used, and the processes of recess etching, isotropic and/or anisotropic etching and reactive ion etching (RIE) will be discussed interchangeably. Suitable masking and photolithographic techniques familiar to those skilled in the art should also be assumed to be used in the following processes. Referring now to FIG. 1, an exemplary layout of a 6 $F^2$ transistor device 120 on the gate conductor (GC) level is shown. As shown, the feature size of the gate conductors is about ½ F. Of course, variations of the feature size can be achieved by varying, for example, the thickness of the spacers. The layout includes the transistor's word lines 122, surface straps 124, bit line contacts 126, deep trenches 128 and shallow trench isolation regions 129. The sub-GR trenches for the gates 130 are also depicted. Illustratively, the depth of the deep trenches 128 is approximately 8 mm; the depth of the shallow trench isolation regions 129 is approximately 0.2 mm. Typically the shallow trench isolation regions are filled with oxide. In the DRAM process that follows, the integration of a connection of the capacitance node (or, in the depicted device, a deep trench node) to the active area will be described. The process will begin with the formation of a buried strap between the two sub-GR trench word lines 122 which will connect the deep trench node to the active device area. The active device area is the part of the device which does not include the trench or STI. The buried strap itself can be formed in the process, self-aligned as a sub-GR feature.

Figure 2A:
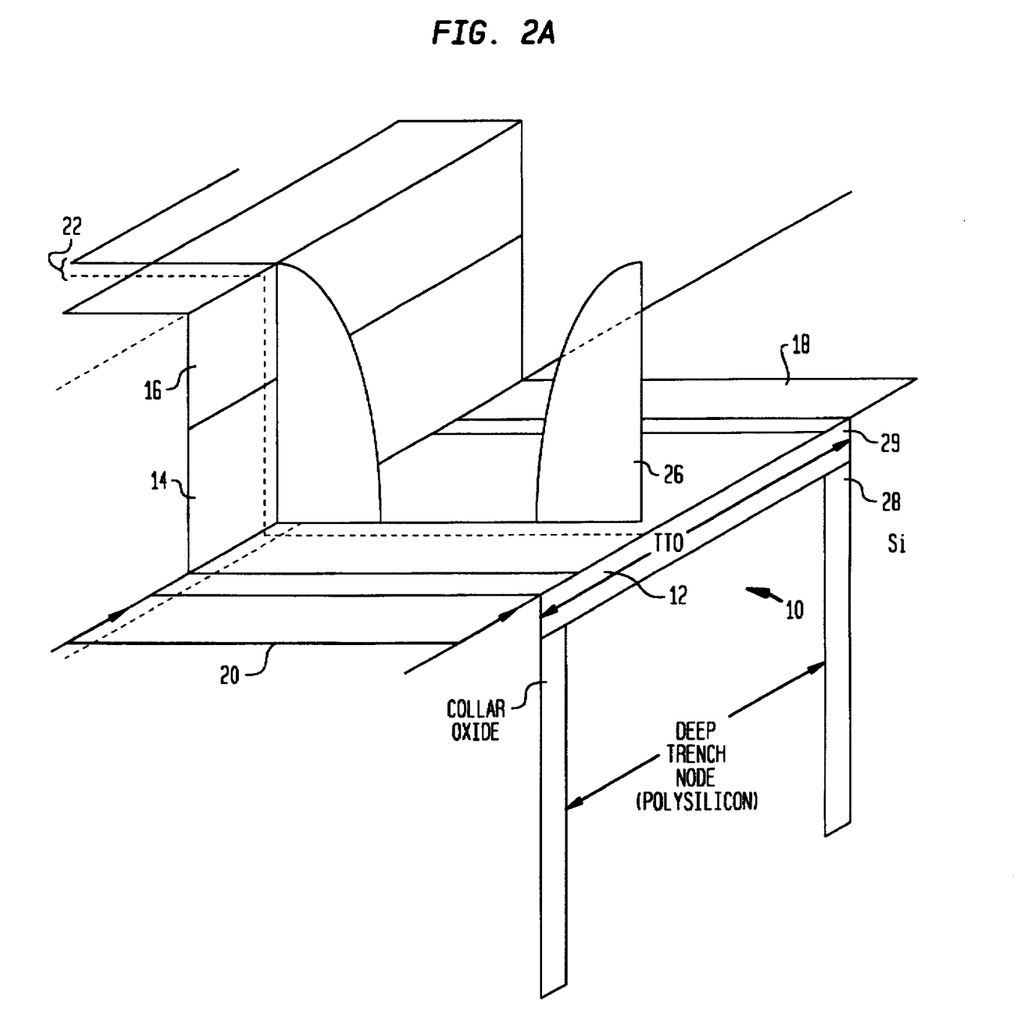
FIGS. 2A–2F depict the process flows that create sub-GR gates in a deep trench DRAM cell according to a first preferred embodiment of the present invention.

FIGS. 2A–2F depict the process flow for creating an exemplary embodiment of a sub-GR gate conductor in a trench transistor 10. Referring to FIG. 2A, there is shown the top surface of a planarized semiconductor wafer 11 which, for example, is made out of single crystal silicon. An oxide layer 12 which is approximately 50 nm thick has been deposited on the top surface of all deep trenches 10 as shown. This oxide layer is commonly referred to as the trench top oxide (TTO). A collar oxide 13 is located between the trench 10 and single crystal substrate 18. Above the collar oxide and between the TTO and single crystal substrate, there exists a section 28 filled with nitride. Section 28 is referred to as a nitride seal. The nitride seal 28 is approximately 40 nm wide. Above the nitride seal 28 is a section 29 of the TTO layer. A sacrificial nitride layer 14 of approximately 150 nm thickness is then deposited over the entire surface of the TTO layer 12 and the silicon substrate 18. A sacrificial polysilicon layer 16 of approximately 100 nm thickness is then deposited over the nitride layer 14. The region is then covered with a resist layer (not shown) consisting of a deep ultraviolet (DUV) trench gate mask. A trench 20 is then etched into the polysilicon 16 and nitride 14 layers which removes them exposing the top surface of the TTO layer 12. A resist strip is then performed to remove the remaining resist layer used as the mask, and an oxide liner 22 of approximately 15 nm in thickness is deposited over the surface of the newly formed trench 20 as shown. A 100 nm sacrificial nitride spacer layer 26 is then formed on both sides of the trench.

Figure 2B:
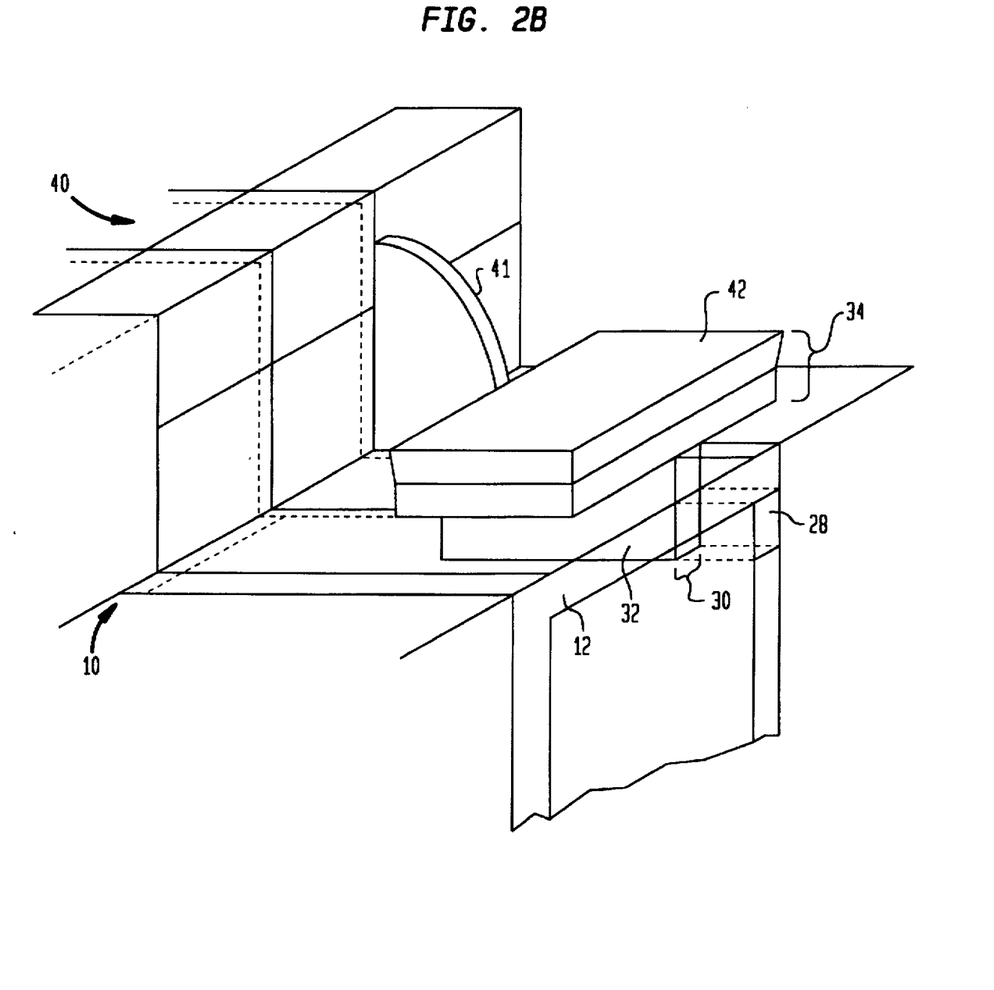

Referring now to FIG. 2B, the next steps in the processing of the trench transistor 10 are depicted. A surface strap (SS) mask (not shown) is first laid down on the surface of the device. A nitride seal and oxide collar recess step is then performed resulting in a trench 30 which is cut through the TTO layer into the oxide collar 12. The surface strap mask is then removed, and the trench 30 is filled with polysilicon 32. The polysilicon 32 is then recess etched approximately 50 nm, and the new trench that is formed is filled with oxide 34. This oxide layer 34 fills the trench and extends above the TTO surface 12. The oxide layer is then recess etched to be level with the top surface of the TTO layer 12. An oxide liner 41 approximately 10 nm thick is then deposited as shown. The region is then filled with polysilicon 42 which is then recess etched to a thickness of approximately 30 nm.

Figure 2C:
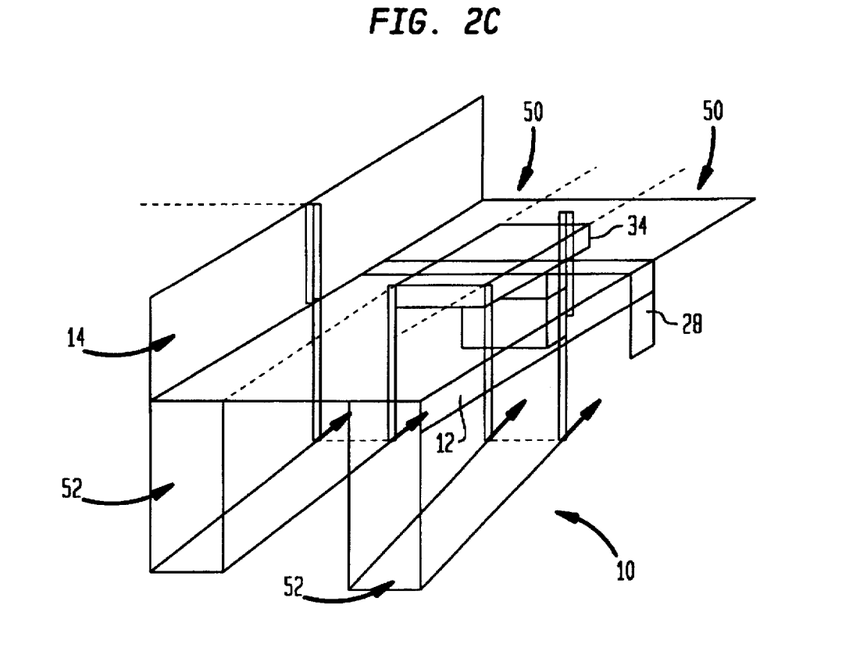

Referring now to FIG. 2C, the next steps in the processing of the trench transistor 10 are shown. The nitride spacer layer 26 (depicted in FIG. 2A) is deglazed and stripped away to the top of the TTO layer 12 leaving recessed out regions 50. An uncritical trim mask is then deposited on the structure to prevent trench etching at the end of the regions 50 in the subsequent oxide/nitride trench etch. An oxide/nitride trench etch is performed removing approximately 150 nm of these initially deposited layers including the oxide liner which had been deposited on the surface of the TTO. The trim mask is then removed and a poly/Si trench etch is then performed leaving trenches 52 in the structure which penetrate into the single crystal silicon substrate to a depth of approximately 150 nm. The poly/Si trench etch also removes the formerly deposited polysilicon layer 42 (depicted in FIG. 2B). An oxide liner is then deposited in the trenches 52, and this oxide liner is anisotropically etched leaving only a thin oxide layer at the side walls to protect the nitride seals 28.

Figure 2D:
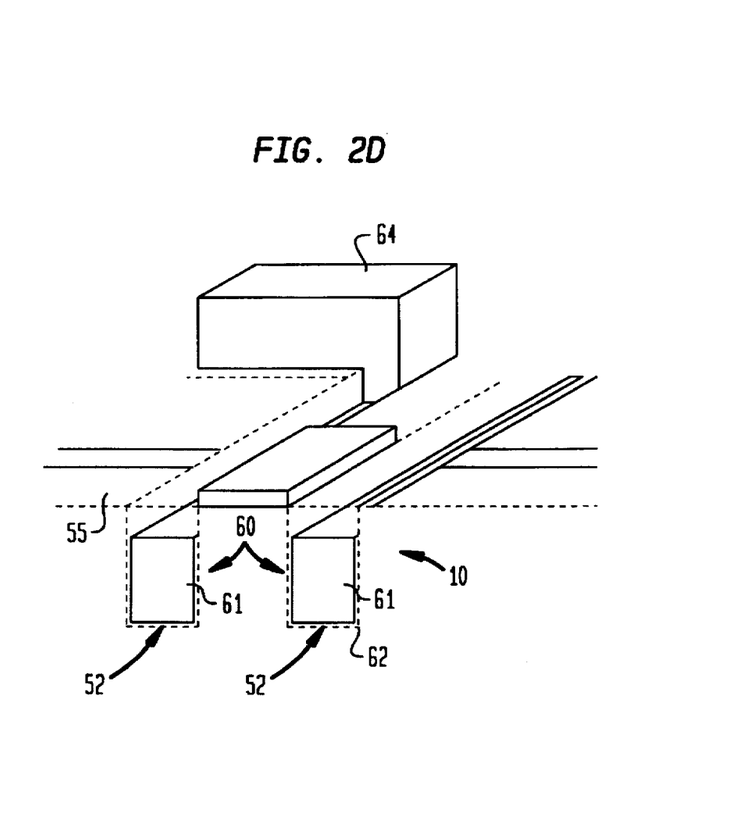

Referring now to FIG. 2D, the next steps in the processing of the trench transistor 10 are depicted. The nitride layer 14 (depicted in FIG. 2A) is stripped away, as is the oxide liner 40 (depicted in FIG. 2B). The PAD oxide under the nitride layer is also stripped approximately 15 nm. A sacrificial oxide layer 55 is then grown over the structure as shown.

Still referring to FIG. 2D, well implants 60 are then created in the structure according to the following procedure. Portions of the sacrificial oxide layer 55 are selectively stripped away and a gate oxide (GOX) layer 62 is put down. A polysilicon layer that will eventually form the buried sub-GR interconnect conductor lines 61 and surface gate conductors (GCs) 64 is then deposited on the structure filling the trenches 52 and rising above the single crystal silicon substrate. This GC polysilicon layer initially extends at least 100 nm above the surface of the substrate. A GC masking layer (not shown) is then deposited on the structure, and a GC etching step removes the unwanted GC polysilicon leaving a surface gate conductor 64 which sits above the single crystal silicon substrate and buried gate conductors 61 the GC polysilicon filled trenches. The GC masking layer is then removed.

Figure 2E:
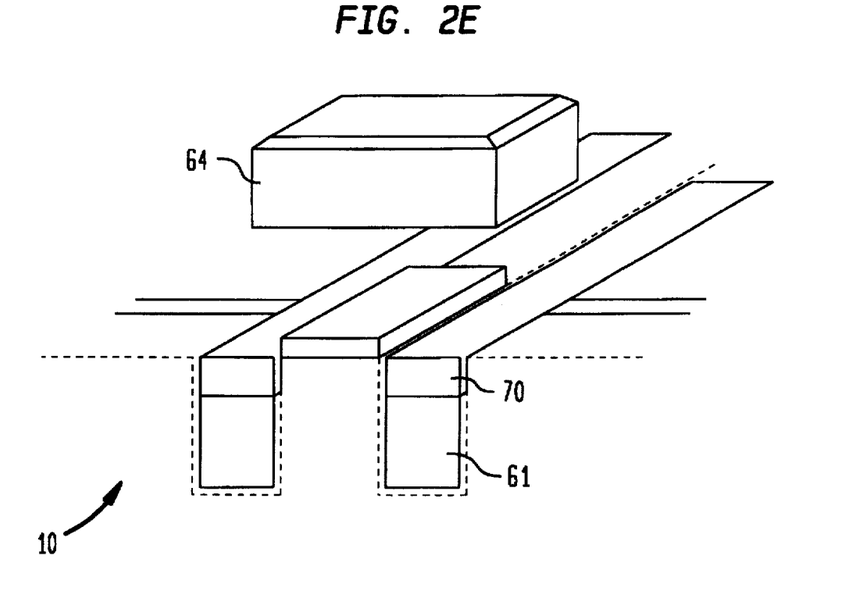

Referring now to FIG. 2E, the next steps in the processing of the trench transistor 10 are depicted. A nitride layer of approximately 50 nm is deposited over the structure, and a nitride spacer/recess etch step produces the layers 70 over the trench gates 61; whereas a nitride spacer 64 is formed along the surface gate conductor.

In order to complete the processing of the trench transistor 10 of the present invention, the following standard processes are performed. These processes are commonly practiced in the semiconductor transistor industry, being needed in virtually every transistor produced, and are familiar to those skilled in the art. As such, there is no need of figures, and the processes will be discussed in minimum detail. The processes begin with a junction process which starts by depositing a nitride liner over the structure depicted in FIG. 2E. A middle of line dielectricum (MOL DE) is then deposited on the structure and a global middle of line (MOL) planarization is done according to standard procedure. A bit line (BL) contact process is then done by a selective oxide-to-nitride etch. A contact to diffusion/contact to gate (CD/CG) process is then performed creating these contact areas in the transistor device. Three metal layer deposition processes (M0, M1 and M2) are then performed. M0, M1 and M2 correspond to the metal zero layer, the metal one layer and the metal two later, respectively. Metals M0, M1 and M2 may be any metal commonly used in the semiconductor transistor industry. In one embodiment, the metals are selected from the group consisting of tungsten, tungsten silicide, titanium, titanium silicide, or copper. The transistor is completed by a final PAD opening process (TV process).

An alternate process flow to the above described trench transistor process can be done in order to minimize the sheet resistance of the buried trench conductor. This process begins after the trenches for the buried trench gate conductor are etched and the gate oxide is grown (FIG. 2D). The GC polysilicon fill layer that creates the buried 61 and surface 64 gate conductors starts with a thin polysilicon liner which is deposited on the gate oxide layer. A GC in-situ-doped polysilicon layer of approximately 20 nm thickness is then deposited over the polysilicon liner. An approximately 10 nm tungsten silicide (WSi) layer is then deposited by chemical vapor deposition (CVD). Over the WSi layer is then deposited an approximately 25 nm layer of tungsten (also by CVD). The tungsten/tungsten silicide combined layer is etched back so that it resides 80 nm below the single crystal silicon substrate surface. An approximately 80 nm GC in-situ-doped polysilicon layer is then deposited on the structure (doping through the use of an ion implant is also possible in place of this step). The process forms a composite structure containing a silicide/metal core surrounded by doped polysilicon which is to be used in place of the original gate conductors formed by the first preferred embodiment process. The thickness of the silicide/metal fill depends on the aspect ratio of the trench in which the buried trench gate conductor resides. Also, other metallization schemes which are useful in place of the tungsten silicide/ tungsten include titanium silicide/titanium (TiSi/Ti) or copper (Cu), both applied by CVD. An appropriate barrier is useful in copper metallization schemes to protect copper diffusion through the gate conductor polysilicon.

Figure 2F:
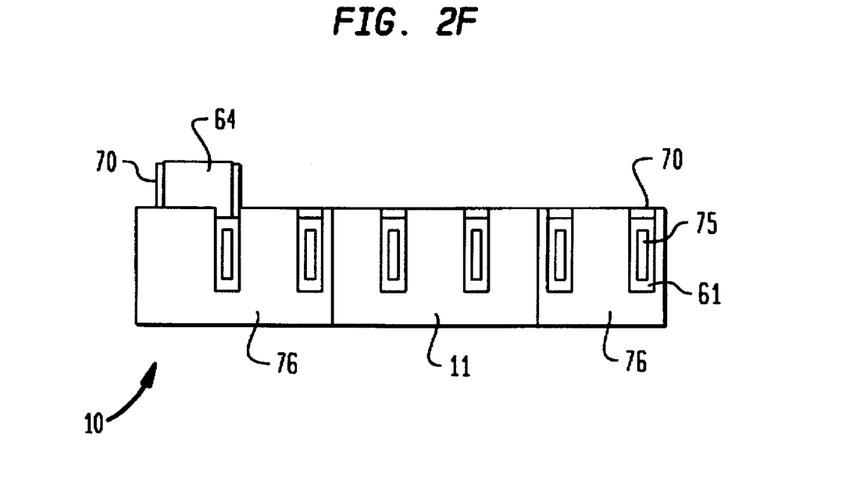

Referring now to FIG. 2F, there is shown a side-on view of the trench transistor device in which the buried trench gate conductors with incorporated silicide/metal lines 75 which are depicted. These buried trench gate conductors are produced by the alternate tungsten silicide/tungsten/titanium silicide/copper process flows described above. The single crystal silicon substrate 11, the sub-GR interconnect conductor lines 61, and shallow trench isolation regions 76 are also depicted, as well as the nitride layers 70 and the gate conductor 64 of FIG. 2E.

As should now be apparent, the present invention substantially overcomes many of the problems associated with the formation of prior art sub-GR gate conductors or interconnect conductor lines. The method addresses, in accordance with the high density goal, a transistor concept which is comparable standard transistor technology. The above described processes, which, for the most part utilize standard gate conductor processes, produce a DRAM trench transistor which has sub-GR gate conductor or interconnect conductor lines. Because of the processes described herein, the resulting transistor is able to achieve a decoupling of channel doping and junction doping. This is due to the fact that in the above constructed device, the fields at the junction can be reduced without compromising off current/threshold requirements due to the vertical dimension of the trench gate. Under certain trade off aspects, such as current drive versus off current leakage, the present device will have better off current characteristics when compared to a standard planar MOS device.

It should be understood that while the presently described process flows are directed towards a deep trench DRAM with 6 $F^2$ cell size, the processes should be equally applicable to DRAM cells of even higher density. Also, the process described herein for a trench (gate) conductor is equally applicable for a buried trench (gate) conductor. The process flows described herein with the trench gate conductor acting as a word line in the DRAM process should also be considered applicable to either deep trench or stacked DRAM processes. Finally, the process flows described herein which take place on a planarized single crystal silicon wafer should be considered equally applicable to silicon on insulator (SOI) technology.

It should be understood that the embodiments described herein are merely exemplary and that a person skilled in the art may make reasonable variations, such as the dimension and/or thickness of the various layers of the trench and gate conductor, and modifications to these embodiments utilizing functionally equivalent elements to those described herein. Any and all such variations or modifications, as well as others which may become apparent to those skilled in the art, are intended to be included with the scope and spirit of the invention as defined by the appended claims.

What is claimed is:

1. A process for fabricating sub-GR gates in a semiconducting substrate of a dynamic random access memory array, said substrate having a deep trench, a shallow trench isolation, and nitride seal regions formed thereon; comprising the steps of:

depositing a sacrificial spacer on said semiconductor substrate;

etching a recess in a selective portion of said sacrificial spacer;

filling said recess with insulating material to form a column-shaped structure having opposing sides;

removing the remaining portion of said sacrificial spacer;

etching a trench along each side of said column-shaped structure of insulating material; and filling trenches with conductive material to form a pair of trench gates.

2. The process according to claim 1, wherein said step of depositing a sacrificial spacer on said semiconductor substrate comprises the steps of:

depositing a layer of oxide on said semiconductor substrate;

depositing a layer of nitride on said layer of oxide; and depositing a layer of polysilicon on said layer of oxide.

3. The process according to claim 2, wherein said step of etching a recess in a selective portion of said sacrificial spacer comprises the steps of:

depositing a resist layer on said layer of polysilicon;

simultaneously etching said layer of polysilicon and said layer of nitride forming a trench therein, said trench extending to the surface of said layer of oxide;

removing said resist layer;

consecutively depositing a liner of oxide and a layer of nitride in said trench; and selectively etching a recess in said nitride layer.

4. The process according to claim 1, further including the formation of surface straps after said step of forming a recess in a selective portion of said sacrificial spacer.

5. The process according to claim 4, wherein said step of forming surface straps includes the steps of:

depositing a surface strap masking layer on said substrate;

simultaneously selectively etching said nitride seals in said substrate and a recess into said layer of oxide; and removing said surface strap mask.

6. The process according to claim 1, wherein said step of filling said recess with insulating material to form a column-shaped structure having opposite sides comprises:

depositing a layer of polysilicon in said recess;

depositing a layer of oxide on said layer of polysilicon; and depositing a layer of polysilicon on said layer of oxide.

7. The process according to claim 3, wherein said step of removing the remaining portion of said sacrificial spacer includes the steps of:

depositing a masking layer on said semiconductor substrate;

selectively etching said oxide and said nitride layers initially deposited on said semiconductor substrate;

removing said masking layer; and removing said nitride layer.

8. The process according to claim 1, wherein said step of etching a trench along each side of said column-shaped structure of insulating material includes the steps of:

etching trenches into said semiconductor substrate;

lining said trenches with oxide;

selectively etching said oxide liner around said nitride seals;

simultaneously removing said nitride layer, said oxide liner and portions of said oxide layer initially deposited on said substrate; and depositing an oxide layer over the resulting structure.

9. The process according to claim 1, wherein said step of filling said trenches with conductive material to form a pair of trench gates includes the steps of:

depositing a gate oxide layer in said trenches;

depositing a polysilicon gate conductor layer on said gate oxide layer;

masking and selectively etching said polysilicon gate conductor layer in order to form gate conductors from said polysilicon gate conductor layer;

removing said masking layer;

depositing a nitride later on the resulting structure; and selectively etching said nitride layer such that it remains disposed only on said gate conductors.

10. The process according to claim 1, further including the step of forming junctions in said semiconductor substrate.

11. The process according to claim 10, wherein said step of forming junctions in said semiconductor substrate includes the steps of:

depositing a nitride liner over said semiconductor substrate;

forming a middle of line dielectricum in said substrate; and planarizing said middle of line dielectricum.

12. The process according to claim 1, further including the step of forming bit line contacts in said semiconductor substrate.

13. The process according to claim 12, wherein said step of forming bit line contacts in said semiconductor substrate includes the step of etching said semiconductor substrate with a selective oxide-to-nitride etching process.

14. The process according to claim 1, further including the step of forming contact to gate and contact to diffusion areas in said semiconductor substrate.

15. The process according to claim 1, further including the step of depositing a plurality of metal layers over said semiconductor substrate.

16. The process according to claim 15 wherein said step of depositing a plurality of metal layers is limited to the deposition of three metal layers.

17. The process according to claim 16, wherein the metals of said metal layers are selected from the group consisting of tungsten, tungsten silicide, titanium, titanium silicide and copper.

18. The process according to claim 1, further including a final pad opening process in said semiconductor substrate which completes the structure of said dynamic random access memory array.

19. The process according to claim 9, wherein said step of depositing a polysilicon gate conductor layer on said gate oxide layer further includes the deposition of a gate conductor in-situ-doped polysilicon layer containing a silicide/metal core.

20. The method according to claim 19, wherein said step of forming a gate conductor in-situ-doped polysilicon layer containing a metal/silicide core comprises the steps of:

depositing a layer of polysilicon on said layer of gate oxide in said trenches;

depositing a layer of gate conductor in-situ-doped polysilicon on said layer of polysilicon;

depositing a layer of metal silicide on said layer of polysilicon;

depositing a layer of metal on said layer of metal silicide;

simultaneously etching said layer of metal and said layer of metal silicide such that they reside below the surface of said substrate; and depositing a layer of gate conductor in-situ-doped polysilicon on the resulting structure.

21. The method according to claim 20, wherein said metal silicide is selected from the group consisting of tungsten silicide and titanium silicide.

22. The method according to claim 20, wherein said metal is selected from the group consisting of tungsten, titanium and copper.

23. The method according to claim 20, wherein said metal silicide is tungsten silicide.

24. The method according to claim 20, wherein said metal is tungsten.

* * * * *